Figure 1:
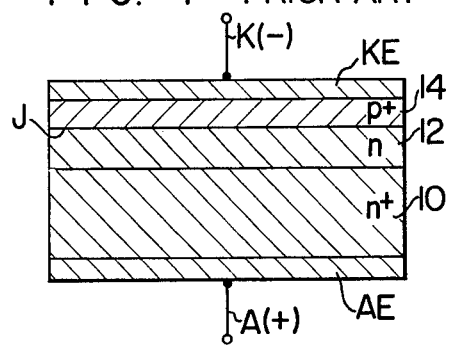

United States Patent [19]

Suzuki et al.

[11] 4,200,877
[45] Apr. 29, 1980

[54] TEMPERATURE-COMPENSATED VOLTAGE REFERENCE DIODE WITH INTERMEDIATE POLYCRYSTALLINE LAYER

[75] Inventors: Takaya Suzuki; Mitsuru Ura; Takuzo Ogawa, all of Hitachi, Japan

[73] Assignee: Hitachi, Ltd., Japan

[21] Appl. No.: 860,118

[22] Filed: Dec. 13, 1977

[30] Foreign Application Priority Data

Dec. 23, 1976 [JP] Japan ................................. 51-155335

[51] Int. Cl.² ............................................. H01L 29/90
[52] U.S. Cl. ....................................... 357/13; 357/28; 357/59; 357/89
[58] Field of Search ........................ 357/13, 59, 89, 28

[56] References Cited

U.S. PATENT DOCUMENTS

| | | | |
|---|---|---|---|
| 3,612,959 | 10/1971 | Simon | 357/13 |
| 3,780,322 | 12/1973 | Walters | 357/13 |
| 3,953,254 | 4/1976 | Valdman | 357/13 |
| 3,990,099 | 11/1976 | Duigon et al. | 357/13 |
| 4,019,195 | 4/1977 | Merino | 357/13 |
| 4,075,649 | 2/1978 | Verdermer | 357/13 |

FOREIGN PATENT DOCUMENTS

| | | | |
|---|---|---|---|
| 2133646 | 1/1972 | Fed. Rep. of Germany | 357/13 |
| 2339006 | 2/1975 | Fed. Rep. of Germany | 357/13 |
| 2711562 | 9/1977 | Fed. Rep. of Germany | 357/13 |
| 923513 | 4/1963 | United Kingdom | 357/13 |
| 1176088 | 1/1970 | United Kingdom | 357/13 |

OTHER PUBLICATIONS

L. Morgenstern, "Temp.-Compensated Zener Diodes," Semiconductor Products, Apr. 1962, pp. 25-29.

*Primary Examiner*—Joseph E. Clawson, Jr.
*Attorney, Agent, or Firm*—Craig and Antonelli

[57] ABSTRACT

Disclosed is a temperature-compensated voltage reference diode comprising a breakdown PN junction for establishing the zener breakdown voltage, a PN junction for temperature compensation having a temperature coefficient opposite to that of the breakdown PN junction, the breakdown PN junction and the temperature-compensating PN junction being integrally formed in a semiconductor substrate in a laminated fashion with these PN junctions connected in inverse series with each other, and a semiconductor region interposed between the breakdown PN junction and the temperature compensating PN junction for substantially preventing a transistor action from taking place between the respective PN junctions, wherein the semiconductor region is formed of at least one of a polycrystalline semiconductor layer and a single crystal semiconductor layer having an impurity concentration of higher than about $5 \times 10^{18}$ atoms/cm$^3$.

11 Claims, 6 Drawing Figures

TEMPERATURE-COMPENSATED VOLTAGE REFERENCE DIODE WITH INTERMEDIATE POLYCRYSTALLINE LAYER

LIST OF PRIOR ART REFERENCES (37 CFR 1.56(a))

The following references are cited to show the state of the art:

Leslie I. Morgenstern, "Temperature-compensated Zener Diodes", Semiconductor Products April, 1962.

U.S. Pat. No. 3,612,959; Edward Simon, patented Oct. 12, 1971, 317-235.

The present invention relates to a temperature-compensated voltage reference element and more particularly to a temperature-compensated voltage reference diode used suitably as a power element for generating a reference voltage, having a zener breakdown voltage of higher than about 6V and a relatively large current capacity.

In the past, the non-destructive breakdown phenomenon in a voltage-reference diode called a zener diode has been generally termed the zener breakdown. Today, however, it is understood that the mechanism of breakdown phenomena is divided into two sorts by a boundary of applied voltage: zener breakdown prevails for voltages lower than 5–6 V while for higher voltages electron avalanche predominates. It is nevertheless assumed in this application that the non-destructive breakdown phenomena in voltage reference diodes are generally called "zener breakdown".

Figure 2:
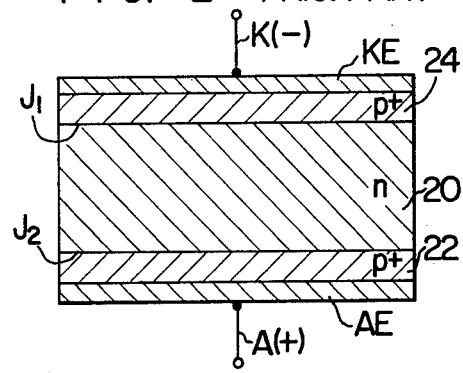
Figure 3:
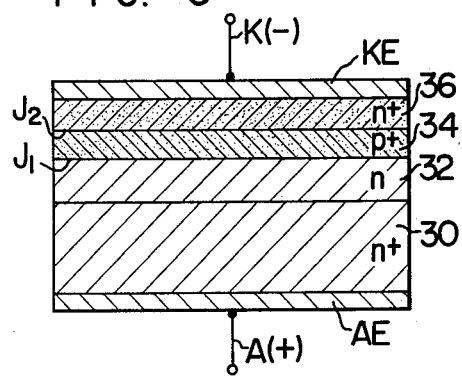
Figure 4:
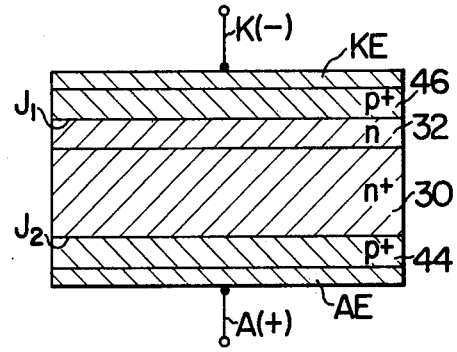
Figure 5:
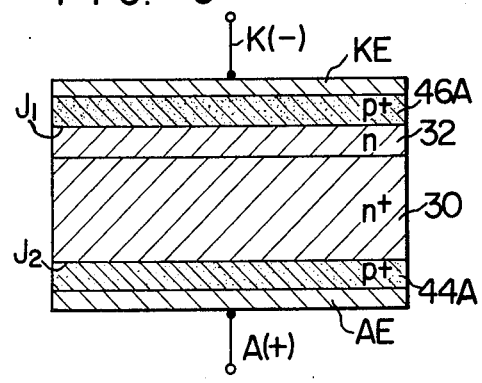
Figure 6:
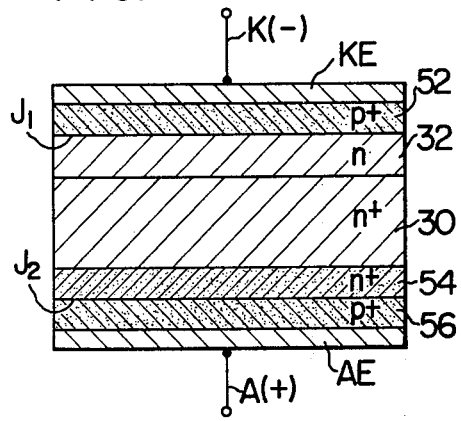

The present invention will now be described by way of embodiment with the aid of the attached drawings, in which:

FIG. 1 schematically shows in cross section an example of a conventional voltage-reference diode;

FIG. 2 schematically shows in cross section an example of a conventional temperature-compensated voltage-reference diode;

FIG. 3 schematically shows in cross section a temperature-compensated voltage-reference diode as a first embodiment of the present invention;

FIG. 4 schematically shows in cross section a temperature-compensated voltage-reference diode as a second embodiment of the present invention;

FIG. 5 schematically shows in cross section a temperature-compensated voltage-reference diode as a third embodiment of the present invention; and FIG. 6 schematically shows in cross section a temperature-compensated voltage-reference diode as a fourth embodiment of the present invention.

The typical constitution of a conventional zener diode is as shown in FIG. 1. This zener diode comprises an N-type semiconductor layer 10 having a relatively high impurity concentration, an N-type semiconductor layer 12 having a relatively low impurity concentration and formed on the N-type layer 10, and a P+-type layer 14 formed on the N-type layer 12 to form a PN junction J for establishing the zener breakdown voltage. A cathode and an anode electrode layer KE and AE connected respectively with a cathode and an anode terminal K and A are kept in ohmic contact respectively with the P+-type layer 14 and the N+-type layer 10. The N-type layer 12 is inserted to make the zener breakdown voltage higher than about 6 V and therefore such an N-layer 12 is generally omitted in the case where the zener breakdown voltage of lower than 6 V is desired.

With the zener diode having the junction structure as shown in FIG. 1, it is a well-known fact that the temperature coefficient of the zener breakdown voltage has a value 0 (zero) for a zener breakdown voltage near 5–6 V and becomes negative or positive according to whether zener breakdown voltage is lower or higher than 5–6 V, respectively.

In the past, there have been proposed some temperature-compensated voltage-reference or zener diodes which are different from that shown in FIG. 1. For example, a temperature-compensated type zener diode available in the market utilizes the fact that the temperature coefficient of the forward voltage of the PN junction is negative and can produce a constant voltage over a comparatively wide range of temperatures by the use of the constitution in which a zener diode having a positive temperature coefficient is combined and connected in series with one or two diodes having a negative temperature coefficient. (For example, refer to the paper titled "Temperature-Compensated Zener Diode" contributed by Leslie I. Morgenstern to the "Semiconductor Products" for April, 1962)

With such a structure, however, the temperature characteristics of the individual elements are not uniform so that there occur such variations in temperature characteristic in the resultant devices as there are combinations of the elements. It was therefore difficult to produce temperature compensated voltage reference elements having a constant temperature coefficient with high reproducibility. Moreover, the cost of this constitution is not inexpensive since at least two diodes are needed as described above. In order to solve these problems, a device may be proposed which is formed of at least two zener diodes fabricated in an IC configuration in a semiconductor substrate to decrease the variations in temperature characteristic. However, this device also has a complicated structure and is not free from the step of patterning by photolithography and the complicated steps of wiring so that the production process is long resulting in increased costs. Further, the fatal drawback of this constitution is that since the junction surface has a small area, the current capacity is small and that it cannot be used as a reference voltage generating device except in small power operations.

FIG. 2 shows a constitution which has been devised to eliminate such drawbacks as described above. In FIG. 2, reference numeral 22 indicates a high impurity concentration region (P+) having an impurity concentration of higher than about $1 \times 10^{18}$ atoms/cm$^3$, 20 a region having a conductivity type (N) opposite to that of the region 22 and having an impurity concentration determined depending on the zener breakdown voltage desired, and 24 a region having the same conductivity type (P+) as the region 22 and an impurity concentration of higher than about $1 \times 10^{18}$ atoms/cm$^3$. It is possible to invert all the conductivities of the regions in the above constitution. AE and KE designate an anode and a cathode electrode as in FIG. 1. Now suppose that a positive and a negative voltage are applied respectively to the anode and cathode electrodes AE and KE, as shown in FIG. 2. Then the junction $J_1$ is reversely biassed and the junction $J_2$ is forward biassed, so that the device appears to be able to compensate for temperature, with the diodes connected in inverse series with each other. However, in the case where the P+ regions 22 and 24 having relatively high impurity concentrations are disposed contiguous to the N region 20 having a relatively low impurity concentration, a phenomenon that the diode loses the function of a voltage-reference element due to the sudden fall of the voltage between the anode and the cathode A and K, may take place owing to the transistor action taking place between the junctions $J_1$ and $J_2$. In order to prevent the phenomenon, the N region 20 must have a relatively large thickness. As a result, there will arise a drawback that the operating resistance becomes large in the operation for obtaining the zener breakdown voltage or the voltage drop becomes large in the same operation. (Such a temperature-compensated zener diode is disclosed in, for example, U.S. Pat. No. 3,612,959)

It is therefore one object of the present invention to provide a novel temperature-compensated voltage-reference element which is free from the above drawbacks.

Another object of the present invention is to provide zener diodes or voltage-reference diodes having an improved temperature characteristic and a temperature coefficient, which can be fabricated with high reproducibility and at low cost.

Yet another object of the present invention is to provide a temperature-compensated zener diode or voltage-reference diode having a relatively high zener breakdown voltage and capable of accepting heavy currents and therefore adapted for larger power purpose.

A further object of the present invention is to provide a temperature-compensated zener or voltage-reference diode having an integrated constitution in a semiconductor substrate.

According to the present invention, which has been made to attain the above objects, there is provided a temperature-compensated zener or voltage-reference diode comprising a semiconductor substrate, a first PN junction for establishing a zener breakdown voltage, a second PN junction for temperature compensation having a temperature coefficient opposite to that of the first PN junction, the first and the second PN junctions being integrally formed in the semiconductor substrate in a laminated fashion with the PN junctions connected in inverse series with each other, and a semiconductor region interposed between the first and second PN junctions for substantially preventing a transistor action from taking place between the first and second PN junctions, wherein the semiconductor region is formed of at least one of a polycrystalline semiconductor layer and a single crystal semiconductor layer having an impurity concentration of higher than about $5 \times 10^{18}$ atoms/cm$^3$.

The average lifetime of carriers in polycrystalline silicon is $2 \times 10^{-11} - 2 \times 10^{-10}$ sec. and by far shorter than the life time of the carriers in a silicon single crystal, as already reported. Accordingly, by using such a polycrystalline semiconductor layer having a large recombination rate to prevent the transistor action from taking place between the two junctions of a temperature-compensated zener or voltage-reference diode, the thickness of the polycrystalline layer can be made small enough to decrease the operating resistance of the zener of voltage-reference diode and therefore to diminish undesirable voltage drop and power loss.

Also, by using a single crystal semiconductor layer having a high impurity concentration of higher than $5 \times 10^{18}$ atoms/cm$^3$ to prevent such a transistor action as described above, the carriers can be annihilated without any increase in the operating resistance. Thus, the effect of preventing the transistor action between the two PN junctions can be substantially achieved. This effect is analogous to that in the case of the polycrystalline semiconductor layer being used as such a transistor action preventive layer.

In the practice of the present invention, it is preferable that one of the two semiconductor regions to form a PN junction for temperature compensation should be formed of a layer for preventing transistor action which layer is of a polycrystalline semiconductor or a single crystal semiconductor having a high impurity concentration. By using such a preferred constitution, a further reduction of the operating resistance and a further simplification of the manufacturing process will be possible.

Moreover, by using a polycrystalline layer as one of the two regions for forming the PN junction for zener breakdown or temperature compensation, junctions having steep gradients of impurity concentration can be effectively formed with high yield.

Further, in the case where one of the two regions for forming the PN junction for temperature compensation is a layer for preventing transistor action which layer is of a single crystal semiconductor having a high impurity concentration, it is preferable for the purpose of increasing the withstand voltage of the PN junction for zener breakdown up to relatively high level that one of the semiconductor regions for forming the breakdown PN junction has the same conductivity type as the layer contiguous to the single crystal semiconductor layer having a high impurity concentration on one hand but has a lower impulity concentration than the last-mentioned layer on the other.

The above and other objects, features and advantages of the present invention will be clear from the following description of the embodiments of the present invention.

FIG. 3 shows in cross section a temperature-compensated voltage-reference diode as one embodiment of the present invention. In FIG. 3, reference numeral 30 designates an N+ region of single crystal having a high impurity concentration; 32 an N region of single crystal having a lower impurity concentration (i.e. a higher resistivity) than the N+ region 30; 34 a P+ region of polycrystalline silicon having a high impurity concentration and having a conductivity type different from that of the region 32; 36 an N+ region of polycrystalline silicon having a high impurity concentration and having a conductivity type different from that of the region 34; reference character $J_1$ indicates a first PN junction which is formed in the interface of the regions 32 and 34 and establishes the zener breakdown voltage; $J_2$ a second PN junction which is formed in the interface of the regions 34 and 36; KE and AE a cathode and an anode electrode of metal, respectively; and K and A a cathode and an anode terminal, respectively.

The method of producing such a structure as described just above is as follows: The N layer 32 about 20 μm thick, having a desired impurity concentration is formed through epitaxial growth on the N+ layer 30 of single crystal, about 250 μm thick, having a high impurity concentration of, for example, about $1.4 \times 10^{18}$ atoms/cm$^3$ (resistivity: lower than 0.02 Ω.cm). The P+ layer 34 of polycrystalline silicon, about 25 μm thick, having a high impurity concentration is formed on the epitaxially grown N layer 32 by the use of the same or another furnace for vapor growth. The N+ layer 36 of polycrystalline silicon having a thickness of about 20 μm is formed on the polycrystalline silicon layer 34 in the same or another furnace for vapor growth. Since the reaction temperature at which the polycrystalline silicon layer is formed through vapor growth is relatively low, e.g. 600°–1100° C., then adverse effect due to impurity diffusing excessively during the formation of each layer hardly takes place so that the distribution of impurity concentration in each of the PN junctions $J_1$ and $J_2$ becomes very steep. And for the same reason the influence on the first PN junction $J_1$ due to the formation of the second PN junction $J_2$ is also negligible. After the completion of the junction structures in the semiconductor, the electrode layers KE nad AE are formed by vapor-depositing metal such as aluminum on the upper and lower surfaces of the substrate. The junction end may have the shape of mesa or planar type or any other suitable type.

With the element shown in FIG. 3, if a positive and a negative voltages are applied respectively to the $N^+$ substrate 30 of single crystal and the $N^+$ layer 36 of polycrystalline silicon, the first PN junction $J_1$ is reversely biassed and causes a zener breakdown at a given voltage. At this time, the second PN junction is forward biassed and minority carriers are injected into the regions 34 and 36. However, since these regions are formed of polycrystalline silicon, the life time of the injected carriers is very short. Therefore, no amplifying action takes place irrespective of the presence in the vicinity of the reverse-biassed first PN junction $J_1$, that is, the resulting switching or transistor action does not take place so that a constant voltage is maintained. The temperature coefficient of the forward-biassed second junction $J_2$, which is negative, compensates for the positive temperature coefficient of the first PN junction $J_1$ and therefore the resultant temperature coefficient is made smaller to improve the temperature characteristic.

In the above description, the same result can be obtained even if the conductivity type P or N of each region or layer is inverted.

In FIG. 3, the $N^+$ region 30 is mainly for improving the ohmic contact thereof with the electrode layer AE and for reinforcing the element as a whole and the thickness of the $N^+$ region 30, determined depending on the convenience in handling, may be smaller than the thickness of any of the $N^+$ regions described above.

The N region usually must have a very low impurity concentration (e.g. lower than $6 \times 10^{17}$ atoms/cm$^3$) so as to establish a high zener breakdown voltage (e.g. higher than about 6V) and therefore it is practically impossible to form the N region 32 of polycrystalline silicon. The thickness of the N region 32 may theoretically have a value greater than the thickness of the depletion layer developed in the case of the reverse bias being applied. The zener diodes with zener breakdown voltages up to several tens of volts have a depletion layer at most 10 $\mu$m thick. The thickness of the region 34 has only to be made greater than the diffusion length of the carriers determined by the impurity concentration in the region 34 and therefore is chosen as described above. The region 36 has only to have a thickness sufficiently greater than that portion of the electrode KE of metal, e.g. Al, which penetrates into the region 36 when formed through, for example, vacuum evaporation. The thickness of the portion ranges from several micrometers to 10 $\mu$m and therefore the value of about 20 $\mu$m, chosen above, is satisfactory.

FIG. 4 shows in cross section a temperature-compensated voltage-reference diode as a second embodiment of the present invention. This embodiment is different from the embodiment shown in FIG. 3 in that the second PN junction to be forward biassed is formed on the opposite side of the $N^+$ region 30 with respect to the first PN junction $J_1$ and that the impurity concentration of the $N^+$ single crystal region 30 is made very high, i.e. higher than about $5 \times 10^{18}$ atoms/cm$^3$.

The embodiment shown in FIG. 4 is produced in the following manner: On one principal surface of an $N^+$ single crystal substrate region 30, more than about 200 $\mu$m thick, having an impurity concentration of higher than about $5 \times 10^{18}$ atoms/cm$^3$ (resistivity of lower than 0.01 $\Omega$.cm) is formed through the well-known method of vapor growth an N single crystal region 32, about 10 $\mu$m thick, having a resistivity higher than thwat of the $N^+$ substrate region 30 (e.g. resistivity of 0.05 $\Omega$.cm for a zener of 8 V). On the N region 32 of single crystal is formed through vapor growth or diffusion a $P^+$ region 46 of single crystal silicon having a high impurity concentration and a conductivity type opposite to that of the single crystal region 32. On the other principal surface of the $N^+$ substrate region 30 is formed also through vapor growth or diffusion a $P^+$ region 44 of single crystal having a high impurity concentration and a conductivity type opposite to that of the substrate region 30. Thus, a wafer structure is completed in which a first PN junction $J_1$ formed of the N region 32 of single crystal and the $P^+$ region 46 of single crystal for substantially establishing the zener breakdown voltage and a second PN junction $J_2$ formed of the $N^+$ region 30 of single crystal and the $P^+$ region 44 of single crystal are integrally constructed in a single semiconductor substrate with the PN junctions $J_1$ and $J_2$ connected in inverse series configuration. In like manner as in the embodiment shown in FIG. 3, metal such as, for example, Al is vapor-deposited on the upper and lower surfaces of the wafer to form metal electrode layers KE and AE. In this case, too, the thickness of the N region 32 of single crystal is made greater than the thickness of the depletion layer generated at the application of the reverse bias, i.e. about 10 $\mu$m, as described with the embodiment shown in FIG. 3. The $N^+$ substrate region 30 should theoretically have a thickness greater than the diffusion length of the carriers determined by the impurity concentration. The diffusion length of holes nearly at room temperatures in the $N^+$ substrate 30 having an impurity concentration of about $5 \times 10^{18}$ atoms/cm$^3$ is about 13 $\mu$m (the diffusion length of electrons in the case where the semiconductor substrate 30 is of $P^+$ type, is about 22 $\mu$m). The diffusion length depends on temperature and increases with the rise of temperature. It is only necessary, therefore, to make the thickness of the $N^+$ substrate 30 greater, i.e. several times greater, than the above mentioned diffusion length under room temperature. However, this thickness is made much greater than the above smallest value possible, i.e. equal to about 200 $\mu$m, for convenience's sake in handling. The thicknesses of the regions 44 and 46 are made sufficiently greater than the thicknesses of those portions of the electrodes AE and KE which penetrate into the regions during the formation thereof through vacuum evaporation. The thicknesses are therefore chosen to be such values as described above.

With the element having such a structure as described above, when the regions 46 and 44 are kept respectively at a negative and a positive potential, the first PN junction $J_1$ is reverse-biassed to cause zener breakdown at a given voltage. At this time, the second PN junction $J_2$ is forward biassed so that the minority carriers are injected into the regions 44 and 30. Since the region 30 has a very high impurity concentration of about $5\times10^{18}$ atoms/cm$^3$, the injected minority carriers vanish in a short time and therefore cannot reach the first PN junction $J_1$ so that no transistor action takes place to develop a constant voltage between the terminals A and K. Moreover, since the forward biassed second PN junction $J_2$ has a negative temperature coefficient, the positive temperature coefficient of the first PN junction $J_1$ is compensated by th negative one so that the resultant temperature coefficient is nearly zero to improve the temperature characteristic.

The conductivities of the semiconductor regions in the second embodiment shown in FIG. 4 can be inverted to obtain almost the same result as in the embodiment in FIG. 4.

FIG. 5 shows in cross section a third embodiment of the present invention, i.e. a variation of the embodiment shown in FIG. 4. This embodiment is different from the embodiment shown in FIG. 4 in that the P+ semiconductor regions 44A and 46A are formed of polycrystalline semiconductor having a high impurity concentration. In this case, those regions 44A and 46A can be formed at relatively lower temperatures of 600°–1000° C. so that the gradients of impurity concentration in the first and second PN junctions $J_1$ and $J_2$ are hardly injured in the formation of those regions. However, in the case where the zener breakdown voltage is high and where no steep gradient of impurity concentration is needed in the first PN junction $J_1$, it is preferable to form the region 46A of single crystal silicon. In this case, too, the conductivities of the semiconductor regions can be inverted to obtain the same result.

FIG. 6 shows in cross section a fourth embodiment of the present invention. In FIG. 6, a first and a second PN junctions $J_1$ and $J_2$ for zener breakdown and for temperature compensation, respectively are formed on both sides of an N+ semiconductor substrate 30 having a high impurity concentration. The first PN junction $J_1$ consists of an N region 32 of single crystal formed on one of the principal surfaces of the substrate 30 and a P+ region 52 of polycrystalline semiconductor having a high impurity concentration, formed contiguous to the N region 32 and the second PN junction $J_2$ is constituted of an N+ region 54 of polycrystalline semiconductor having a high impurity concentration formed on the other principal surface of the substrate 30 and a P+ region 56 of polycrystalline semiconductor having a high impurity concentration, formed contiguous to the N+ region 54.

The diode as the fourth embodiment shown in FIG. 6 is produced in the following manner: On one of the principal surfaces of the N+ substrate region 30 of single crystal having a thickness of about 250 $\mu$m and having a high impurity concentration of higher than about $1.4\times10^{18}$ atoms/cm$^3$ (a resistivity of lower than 0.02 $\Omega$.cm) is formed through the well-known epitaxial growth the N region 32 having a thickness of about 10 $\mu$m and having a higher resistivity (e.g. 0.05 $\Omega$.cm for a zener voltage of 8 V) than and the same conductivity as the N+ substrate region 30. Then, on the N region 32 of single crystal is formed the P+ region 52 of polycrystalline silicon, about 20 $\mu$m thick, having a high impurity concentration under relatively lower temperatures of, for example, 800°–1000° C. On the other principal surface of the N+ substrate region 30 of single crystal is formed through vapor growth under low temperatures of 800°–1000° C. the N+ region 54 of polycrystalline silicon, about 15 $\mu$m thick, having a high impurity concentration and having the same conductivity type as the N+ substrate region of single crystal. Further, on the N+ region 54 of polycrystalline silicon is formed through a similar vapor growth the P+ region 56 of polycrystalline silicon, about 20 $\mu$m thick, having a high impurity concentration and having a conductivity type opposite to that of the region 54. Thus, the structure is completed in which the first PN junction $J_1$ for substantially establishing the zener breakdown voltage and the second PN junction $J_2$ are integrally formed in a single semiconductor crystal with the first and second PN junctions connected in an inverse series configuration. As in the previous embodiments, metal (Al) is vapor-deposited on the upper and lower surfaces of the structure to form metal electrode layers KE and AE. With the element having such a structure as described above, if the regions 52 and 56 are maintained respectively at a negative and a positive potential, the first PN junction $J_1$ is reverse-biassed to cause zener breakdown at a given voltage. At this time, the second PN junction $J_2$ is forward biassed so that the minority carriers are injected into the regions 54 and 56. Since these regions 54 and 56 are formed of polycrystalline silicon having a high impurity concentration, the injected minority carriers vanish in a short time. Accordingly, the injected minority carriers cannot reach the first PN junction $J_1$ so that no amplification or transistor action takes place to develop a constant voltage between the terminals A and K. Moreover, since the forward biassed second PN junction $J_2$ has a negative temperature coefficient, it compensates for the positive temperature coefficient of the first PN junction $J_1$ so that the resultant temperature coefficient becomes nearly zero to improve the temperature characteristic.

The thickness of the region 32 must be made slightly more than the thickness of the depletion layer formed when the first PN junction $J_1$ is reversely biassed, as described in the previous embodiments. In this case, however, the minority carriers injected into the regions 54 and 56 which are formed of polycrystalline semiconductor having a high impurity concentration, can be annihilated in a short time in the regions so that the thickness of the N substrate region 30 is selected only to maintain the toughness required in handling and can theoretically be made as small as desired. In the case, however, where the current flowing through the voltage-reference diode in its normal operation is so large that the injected carriers may not be completely annihilated in the region 54, it is preferable to make the impurity concentration of the region 30 as high as about $5\times10^{18}$ atoms/cm$^3$, as described in the embodiments shown in FIGS. 4 and 5. The thickness of the region 30 in this case is determined according to such measures as described in the embodiments shown in FIGS. 4 and 5. Further, in order to annihilate the injected minority carriers in a short time in the region 54, the thickness of the region 54 must be determined depending on the diffusion length of the minority carriers which varies with the impurity concentration of the region 54. The thicknesses of the regions 52 and 56 are determined according to such measures as described to determine the regions 44 and 46 in the embodiment shown in FIG. 4.

The objects of the present invention can also be attained by substituting a P+ region of polycrystalline silicon having a high impurity concentration for the P+ polycrystalline silicon layer 52 of high impurity concentration contributing to the first PN junction $J_1$. Therefore, the P+ region 52 can be formed also by the diffusion process. Almost the same result can be obtained even if all the conductivity types of the respective semiconductor regions of the diode shown in FIG. 6 are inverted.

By constituting the second PN junction $J_2$ to be forward biassed of the polycrystalline silicon layers 54 and 56 having high impurity concentrations formed through low-temperature vapor growth in the last embodiment, the two following effects are simultaneously realized: Namely, the first one is that the life time of the injected minority carriers is so short that no amplification or transistor action may take place to develop a constant voltage between the terminals A and K; and the second one is that since the polycrystalline silicon layer can be formed under lower temperatures, the steep gradient of the distribution of the impurity concentration in the first PN junction $J_1$ having already been formed can be prevented from collapsing due to heat.

As described above, according to the present invention, the following advantages can be obtained:

(1) Since the polycrystalline layer or the high impurity concentration layer is used as the semiconductor layer to prevent transistor action, the desired function to prevent transistor action can be realized without increasing the thickness of the layer and the operating resistance (and the resultant loss) of the voltage-reference diode can be reduced.

(2) Since the first PN junction reverse-biassed for substantially defining the zener breakdown voltage and the second PN junction forward biassed and having a negative temperature coefficient are integrally formed in a single semiconductor crystal, zener (or voltage-reference) diodes having an improved temperature characteristic can be manufactured with high reproducibility.

(3) Since a planar junction structure having a large junction area can be easily realized, a zener (or voltage-reference) diode having an improved temperature characteristic and capable of treating heavy current can be produced.

(4) Since the second PN junction to be forward biassed to compensate for the temperature coefficient associated with the breakdown voltage is formed of polycrystalline or single crystal silicon layers having high impurity concentrations, the function to prevent the transistor action can be effected by preventing the carriers injected from the second PN junction from affecting the first PN junction for substantially establishing the zener breakdown voltage so that an inexpensive voltage-reference diode having a lower operating resistance of high reproducibility, simple in structure and production method can be provided.

What we claim is:

1. A temperature-compensated voltage-reference diode comprising:
   a semiconductor substrate;
   a first PN junction having a given zener breakdown voltage and having a first temperature coefficient, said first PN junction being reverse-biased;
   a second PN junction for temperature compensation having a second temperature coefficient of opposite sign to said first temperature coefficient of said first PN junction and being forward-biased, said second PN junction together with said first PN junction being integrally formed in said semiconductor substrate in a laminated fashion with said first and second PN junctions connected in inverse series with each other; and
   a semiconductor region interposed between said first and second PN junctions to substantially prevent a transistor action from taking place between said first and second PN junctions, said semiconductor region including therein a polycrystalline semiconductor layer.

2. A temperature-compensated voltage-reference diode as claimed in claim 1, wherein said semiconductor region for preventing transistor action includes therein a first polycrystalline semiconductor layer having one conductivity type, and wherein one of a pair of semiconductor regions constituting said second PN junction is said first polycrystalline semiconductor layer.

3. A temperature-compensated voltage-reference diode as claimed in claim 2, wherein the other of said pair of said semiconductor regions constituting said second PN junction is a second polycrystalline semiconductor layer having the other conductivity type.

4. A temperature-compensated voltage-reference diode as claimed in claim 3, wherein one of a pair of semiconductor regions constituting said first PN junction is said first polycrystalline semiconductor layer.

5. A temperature-compensated voltage-reference diode as claimed in claim 4, wherein the other of said pair of said semiconductor regions constituting said first PN junction is a single crystal semiconductor layer having the other conductivity type and having a thickness greater than that of the depletion layer which is to be generated when said first PN junction is reversely biassed, said thickness substantially determining said zener breakdown voltage.

6. A temperature-compensated voltage-reference diode as claimed in claim 3, wherein one of a pair of semiconductor regions constituting said first PN junction is a third polycrystalline semiconductor layer having the other conductivity type.

7. A temperature-compensated voltage-reference diode as claimed in claim 6, wherein the other of said pair of said semiconductor regions constituting said first PN junction is a single crystal semiconductor layer having said one conductivity type and having a thickness greater than that of the depletion layer which is to be generated when said first PN junction is reversely biassed, said thickness substantially determining said zener breakdown voltage.

8. A temperature-compensated voltage-reference diode as claimed in claim 1, wherein said semiconductor region for preventing said transistor action comprising a first single crystal semiconductor layer having one conductivity type and having an impurity concentration of higher than about $5 \times 10^{18}$ atoms/cm$^3$ and a first polycrystalline semiconductor layer having said one conductivity type and formed contiguous to one of the principal surfaces of said first single cyrstal semiconductor layer, and wherein one of a pair of semiconductor regions constituting said second PN junction is said first polycrystalline semiconductor layer.

9. A temperature-compensated voltage-reference diode as claimed in claim 8, wherein the other of said pair of said semiconductor regions constituting said second PN junction is a second polycrystalline semiconductor layer having the other conductivity type.

10. A temperature-compensated voltage-reference diode as claimed in claim 8, wherein one of a pair of semiconductor regions constituting said first PN junction is a second single crystal semiconductor layer having said one conductivity type and formed contiguous to the other principal surface of said first single crystal semiconductor layer, and wherein said second single crystal semiconductor layer has an impurity concentration higher than that of said first single crystal semiconductor layer and has a thickness greater than that of the depletion layer which is to be generated when said first PN junction is reverse-biassed, said thickness of said second single crystal semiconductor layer substantially determining the zener breakdown voltage.

11. A temperature-compensated voltage-reference diode as claimed in claim 1, wherein said semiconductor region for preventing said transistor action further includes a single crystal semiconductor layer having an impurity concentration of higher than about $5 \times 10^{18}$ atoms/cm$^3$.